US008828857B2

(12) United States Patent
Lui et al.

(10) Patent No.: US 8,828,857 B2
(45) Date of Patent: *Sep. 9, 2014

(54) APPROACH TO INTEGRATE SCHOTTKY IN MOSFET

(71) Applicant: Alpha and Omega Semiconductor Incorporated, Sunnyvale, CA (US)

(72) Inventors: Sik Lui, Sunnyvale, CA (US); Yi Su, Sunnyvale, CA (US); Daniel Ng, Cambell, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/873,017

(22) Filed: Apr. 29, 2013

(65) Prior Publication Data
US 2014/0151790 A1 Jun. 5, 2014

Related U.S. Application Data

(63) Continuation of application No. 13/079,675, filed on Apr. 4, 2011, now Pat. No. 8,431,470.

(51) Int. Cl.
*H01L 21/28* (2006.01)
*H01L 21/02* (2006.01)

(52) U.S. Cl.
USPC .......................................... 438/576; 257/284

(58) Field of Classification Search
USPC ................................ 257/155, 267, 284, 449, 257/E29.271–E29.317; 438/571–576
See application file for complete search history.

(56) References Cited

U.S. PATENT DOCUMENTS

| | | | |
|---|---|---|---|
| 6,351,018 B1 | 2/2002 | Sapp | |
| 6,509,233 B2 | 1/2003 | Chang | |
| 7,285,822 B2 | 10/2007 | Bhalla | |
| 7,436,022 B2 | 10/2008 | Bhalla | |
| 7,453,119 B2 | 11/2008 | Bhalla | |
| 7,605,425 B2 | 10/2009 | Bhalla | |
| 7,737,522 B2 * | 6/2010 | Lui et al. | 257/472 |
| 7,745,878 B2 | 6/2010 | Bhalla | |
| 7,750,447 B2 | 7/2010 | Chang | |
| 7,767,526 B1 | 8/2010 | Lee | |
| 7,799,646 B2 | 9/2010 | Su et al. | |

(Continued)

OTHER PUBLICATIONS

Non Final Office Action for U.S. Appl. No. 13/079,675 dated Aug. 23, 2012.

(Continued)

*Primary Examiner* — Calvin Lee
(74) *Attorney, Agent, or Firm* — Joshua D. Isenberg; JDI Patent

(57) ABSTRACT

An integrated structure combines field effect transistors and a Schottky diode. Trenches formed into a substrate composition extend along a depth of the substrate composition forming mesas therebetween. Each trench is filled with conductive material separated from the trench walls by dielectric material forming a gate region. Two first conductivity type body regions inside each mesa form wells partly into the depth of the substrate composition. An exposed portion of the substrate composition separates the body regions. Second conductivity type source regions inside each body region are adjacent to and on opposite sides of each well. Schottky barrier metal inside each well forms Schottky junctions at interfaces with exposed vertical sidewalls of the exposed portion of the substrate composition separating the body regions.

20 Claims, 16 Drawing Sheets

(56) References Cited

U.S. PATENT DOCUMENTS

| | | |
|---|---|---|
| 7,829,947 B2 | 11/2010 | Hebert |
| 7,851,856 B2 | 12/2010 | Hebert |
| 7,863,675 B2 | 1/2011 | Bhalla |
| 7,867,852 B2 | 1/2011 | Lee |
| 7,875,541 B2 | 1/2011 | Tai |
| 7,879,676 B2 | 2/2011 | Lee |
| 8,431,470 B2 * | 4/2013 | Lui et al. ............... 438/576 |
| 2002/0123196 A1 | 9/2002 | Chang |
| 2008/0265289 A1 | 10/2008 | Bhalla |
| 2008/0265312 A1 | 10/2008 | Bhalla et al. |
| 2009/0039456 A1 | 2/2009 | Bhalla |
| 2009/0114949 A1 | 5/2009 | Hebert |
| 2009/0127593 A1 | 5/2009 | Bhalla |
| 2009/0181503 A1 | 7/2009 | Bhalla |
| 2009/0224316 A1 | 9/2009 | Bhalla |
| 2009/0242973 A1 | 10/2009 | Hebert et al. |
| 2010/0090276 A1 | 4/2010 | Bhalla |
| 2010/0148246 A1 | 6/2010 | Bhalla |
| 2010/0155876 A1 | 6/2010 | Pan |
| 2010/0225296 A1 | 9/2010 | Chang et al. |
| 2010/0258897 A1 | 10/2010 | Lui |
| 2010/0314693 A1 | 12/2010 | Su et al. |
| 2010/0320461 A1 | 12/2010 | Su |
| 2010/0330767 A1 | 12/2010 | Lui |
| 2011/0014766 A1 | 1/2011 | Hebert |
| 2011/0037120 A1 | 2/2011 | Chen |
| 2011/0039383 A1 | 2/2011 | Chen |
| 2011/0042724 A1 | 2/2011 | Bhalla |
| 2011/0042727 A1 | 2/2011 | Pan et al. |
| 2011/0042742 A1 | 2/2011 | Bhalla |
| 2011/0049564 A1 | 3/2011 | Guan |
| 2011/0049618 A1 | 3/2011 | Lee et al. |
| 2011/0068386 A1 | 3/2011 | Tai et al. |
| 2011/0068395 A1 | 3/2011 | Hebert |
| 2011/0073906 A1 | 3/2011 | Bobde |
| 2011/0073943 A1 | 3/2011 | Hebert |
| 2011/0076815 A1 | 3/2011 | Bhalla |

OTHER PUBLICATIONS

U.S. Appl. No. 12/606,005, entitled "Multiple Layer Barrier Metal for Device Component Formed in Contact Trench" filed Oct. 26, 2009.

U.S. Appl. No. 12/643,837, entitled "Method of Forming a Self-Aligned Charge Balanced Power DMOS" filed Dec. 21, 2009.

U.S. Appl. No. 12/722,384, entitled "Shielded Gate Trench MOS With Improved Source Pickup Layout" filed Mar. 11, 2010.

U.S. Appl. No. 12/731,112, entitled "Oxide Terminated Trench MOSFET With Three or Four Masks" filed Mar. 24, 2010.

U.S. Appl. No. 12/782,573, entitled "Dual Gate Oxide Trench MOSFET With Channel Stop Trench and Three or Four Masks Process" filed May 18, 2010.

U.S. Appl. No. 12/826,591 entitled "A Power MOSFET Device with Self-Aligned Integrated Schottky and Its Manufacturing Method" filed Jun. 29, 2010.

U.S. Appl. No. 12/968,179, entitled "Self Aligned Trench MOSFET With Integrated Diode" filed Dec. 14, 2010.

U.S. Appl. No. 13/010,427, entitled "Trench Poly ESD Formation for Trench MOS and SGT" filed Jan. 20, 2011.

U.S. Appl. No. 12/610,052, entitled "Staggered Column Superjunction" filed Oct. 30, 2009.

* cited by examiner

APPROACH TO INTEGRATE SCHOTTKY IN MOSFET

PRIORITY CLAIM

This application is a continuation of and claims the priority benefit of commonly owned, U.S. patent application Ser. No. 13/079,675, to Sik Lui et al., filed Apr. 4, 2011 now U.S. Pat. No. 8,431,470 issued Apr. 30, 2013, and entitled "APPROACH TO INTEGRATE SCHOTTKY IN MOSFET" the entire disclosures of which are incorporated herein by reference.

FIELD OF INVENTION

Embodiments of the present invention are related MOSFET devices and more specifically to a new approach for integrating a Schottky diode in a MOSFET device.

BACKGROUND OF INVENTION

Schottky diodes have been used to replace P-N junction diodes in many applications. In particular, Schottky diodes have been used to replace P-N junction diodes in power MOSFETs (i.e., MOSFET with body diode in parallel with source and drain). Power MOSFETs that implement P-N junction diodes exhibit several undesirable characteristics, which include: large forward conduction loss, storage of charge between body-epitaxial junction when operating in forward bias, excess stored minority charges which cause large recovery currents and voltage overshoots when the power MOSFET is switched from forward bias to reverse bias, generation of radio frequency interference during fast switching. All of these characteristics cause unnecessary stress to the device, leading to sub-optimal performance.

Schottky diodes exhibit several desirable characteristics which make it preferable over P-N diodes, particularly in a power MOSFET configuration. The low forward drop of the Schottky diode during forward conduction reduces power dissipation of the device and leads to lower conduction loss. The conduction of the Schottky is carried out by majority carriers, so minority carrier charge storage effects do not occur during switching of the device. As such, the Schottky diode is preferred in power MOSFET configurations.

As applications of power MOSFETs employing Schottky diodes become more widespread, it becomes even more important to improve the device configuration to reduce productions costs. One particular important consideration is the reduction of surface areas on the semiconductor substrate occupied by the Schottky diodes. Reduction of surface-area utilization of Schottky diodes provides a key to reducing the manufacturing costs and further miniaturizing the size and shape of electronic devices to achieve portability and other functional enhancements.

It is within this context that embodiments of the present invention arise.

DESCRIPTION OF SPECIFIC EMBODIMENTS

Introduction

Figure 1:
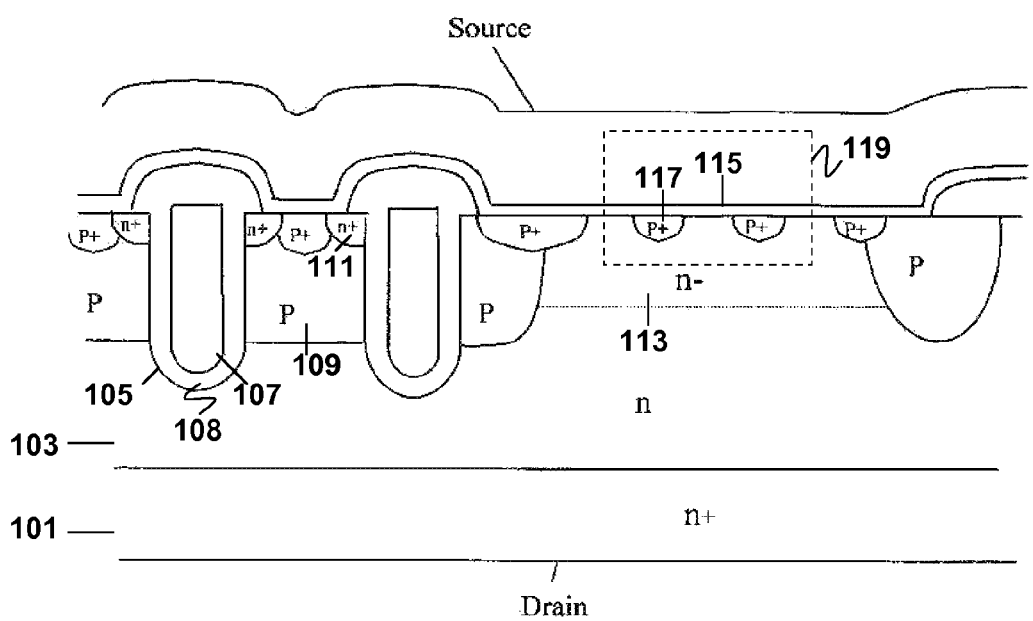
FIG. 1 is a cross-sectional schematic diagram of a prior art integrated structure.
Figure 2:
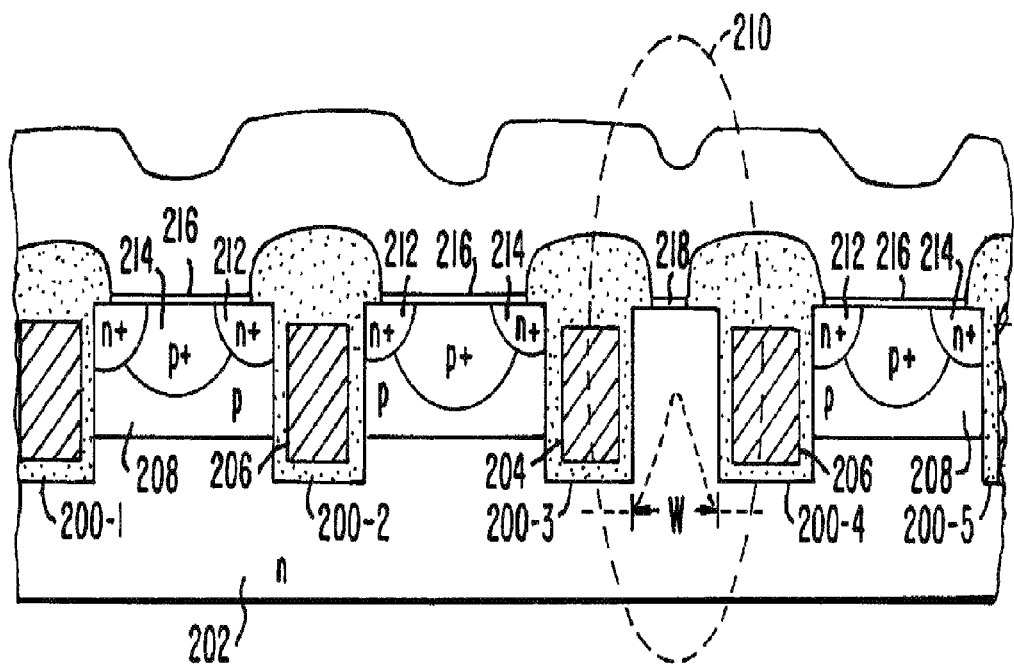
FIG. 2 is a cross-sectional schematic diagram of an alternative prior art integrated structure.
Figure 3:
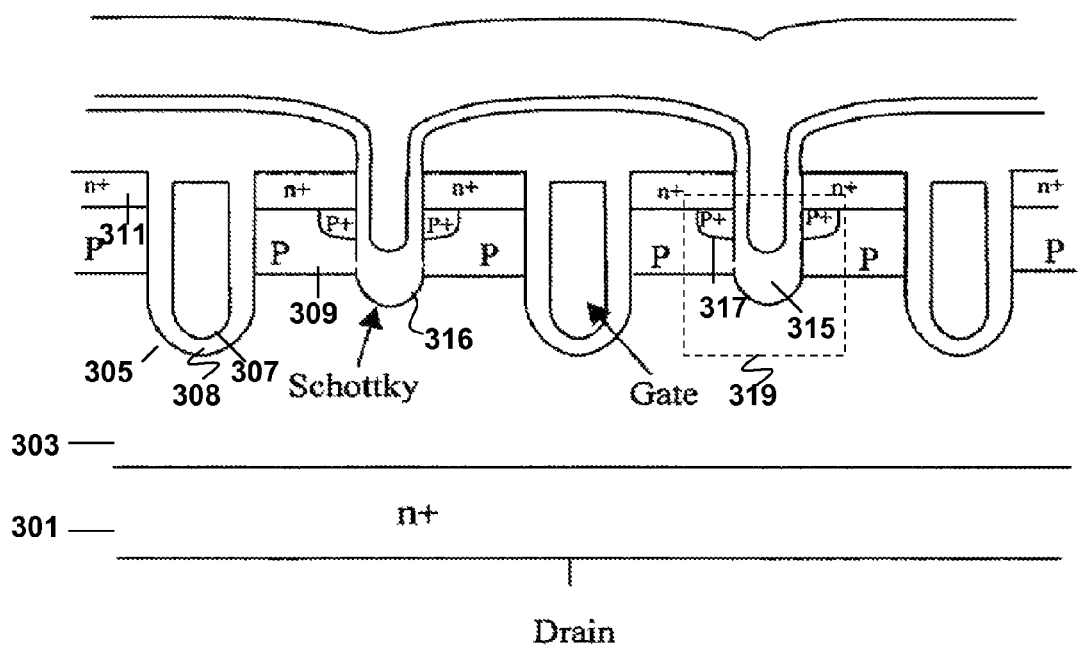
FIG. 3 is a cross-sectional schematic diagram of an alternative prior art integrated structure.

Several configurations exist for integrating a Schottky diode with a MOSFET to form a power MOSFET. These configurations, however, all suffer from certain undesirable characteristics which make them less than optimal power MOSFET devices. FIGS. 1-3 illustrate three such prior art configurations.

FIG. 1 illustrates a prior art integrated structure with multiple MOSFET devices and a junction barrier Schottky (JBS) in parallel with those MOSFET devices. The integrated structure 100 includes an n+ type substrate 101 with an n type epitaxial layer 103. Several MOSFETs are built into the integrated structure 100. A trench 105 is fabricated into the epitaxial layer 103 and filled with conductive material 107 surrounded by an insulation layer 108 to form each gate region 107 of each MOSFET in the integrated structure 100. An area of the epitaxial layer 103 surrounding each trench is doped with p-type material to form the body region 109 of each MOSFET. Each body region 109 is doped with n+ type conductivity dopants on portions adjacent sidewalls of the trench 105 to form source regions 111 of each MOSFET device. The n+ substrate 101 provides a drain region for each MOSFET.

A junction barrier Schottky (JBS) 119 is also built into the integrated structure 100. The Schottky diode 119 includes Schottky barrier metal 115 formed directly on top of an n− doped region 113. The n− doped region 113 is formed in the epitaxial layer 103 in an area that sits between two MOSFET body regions 109. A Schottky junction is formed at the interface between the Schottky barrier metal 115 and the n− doped region 113. Thus, the barrier metal 115 forms the anode of the Schottky diode and the substrate 101 forms the cathode of the Schottky diode. Additionally, one or more p+ doped shielding regions 117 may be formed within the n− doped region 113, forming P-N junctions that act to pinch-off the channel regions under the Schottky contacts to inhibit the formation of large reverse leakage currents caused by switching from forward bias to reverse bias.

While this particular configuration does indeed produce a power MOSFET device with a Schottky diode, it suffers from the disadvantage of having a reduced Schottky surface area due to the p+ shielding. For Schottky diodes with a higher breakdown voltage, a deeper p+ junction is usually required. Thus, the Schottky surface area utilization could be quite low for a high breakdown voltage JBS. The formation of the Schottky diodes requires a dedicated area in the MOSFET, resulting a larger die.

FIG. 2 illustrates an alternative prior art integrated structure comprising a monolithically integrated Schottky diode together with a high performance trenched gate MOSFET. The integrated structure 201 includes a plurality of trenches 200-1, 200-2, 200-3, 200-4 that are patterned and etched into an n type substrate 202. A thin layer of dielectric 204 is then formed along the walls of the trenches 200, after which conductive material 206 is deposited to substantially fill each trench 200, forming a gate region for each MOSFET of the integrated structure 201. A p– type well 208 is then formed between trenches 200, except between those trenches (e.g., 200-3 and 200-4) where a Schottky diode is to be formed. The p– type well 208 makes up the body region for each MOSFET of the integrated structure 201. N+ type source regions 212 are then formed inside p– type well regions 208. The substrate 202 forms the drain region of each MOSFET of the integrated structure 201.

A Schottky diode 210 is also formed within the integrated structure 201 by depositing Schottky barrier metal 218 on top of the substrate 202 in an area that does not contain a p– type well. The Schottky barrier metal 218 forms the anode of the Schottky diode 210 and the substrate forms the cathode terminal of the Schottky diode 210. The Schottky diode 210 is surrounded on both sides by MOSFET trenches 200.

This configuration resolves the issue of Schottky surface area utilization because there is no longer a need to form p– type doped regions between the Schottky barrier metal 218 and substrate 202 in order to inhibit large reverse leakage currents in the reverse biased condition. Rather, as voltage builds on the cathode of the Schottky diode, the MOSFET trenches 200-3, 200-4 surrounding the diode form a depletion region which helps reduce the diode leakage current caused by the reverse biasing. Furthermore, the distance W between the trenches 200-3, 200-4 can be adjusted such that the growing depletion regions around each trench overlap in the middle, which pinches off the drift region between the Schottky barrier metal 218 and the substrate 202.

While the integrated structure configuration in FIG. 2 better utilizes Schottky surface area, it does so at the expense of having to allocate certain undoped areas between MOSFETs solely for the formation of a Schottky diode. This involves extra processing steps during fabrication. Furthermore, this integrated structure still requires a larger-sized die, which is essentially the same disadvantage as a JBS diode.

FIG. 3 illustrates yet another integrated structure comprising a MOSFET and Schottky diode in every MOSFET cell. The integrated structure 300 includes an n+ type substrate 301 with an n type epitaxial layer 303. Several MOSFETs are built into the integrated structure 300. A trench 305 is fabricated into the epitaxial layer 303 and filled with conductive material 307 surrounded by an insulation layer 308 to form each gate region 307 of each MOSFET in the integrated structure 300. An area surrounding each trench is doped with p type material to form the body region 309 of each MOSFET. Each body region 309 is doped with n+ type conductivity material 311 on adjacent sidewalls of the trench 305 to form source regions 311 of each MOSFET device. Finally, the n+ substrate 101 provides a drain region for each MOSFET.

A Schottky diode 319 is also built into each cell of the integrated structure 300. A contact trench 316 is initially formed in the body region 309 of each MOSFET, such that the tip of the contact trench 316 extends beyond the body region 309 into the epitaxial region 303. Each contact trench 316 is filled with Schottky barrier metal 315 such that a Schottky junction is formed at the interface between the tip of the contact trench 316 and the epitaxial region 303. The Schottky barrier metal 315 lining the contact trench 316 acts as the anode of the Schottky diode 319, and the substrate 301 acts as the cathode of the Schottky diode 319. Additionally, one or more p+ doped regions 317 may be formed within the body region 309 along the sidewalls of the contact trench 316 to improve the contact to the body region.

This configuration seems to rectify the issue of surface area utilization, by eliminating the need for allocating an dedicated region between MOSFETs for the formation of a Schottky diode by integrating the Schottky diode within the MOSFET active device area (i.e., within the body region of a MOSFET device).

While the integrated structure configuration in FIG. 3 efficiently utilizes Schottky surface area and eliminates the need for reserving additional device area for the fabrication of Schottky diodes, it still suffers from undesirable characteristics. Because the Schottky barrier metal must be in direct contact with n– type material in order to properly form a Schottky diode, the contact trench created within the p– type body region must be deeper than the body junction depth. In order to obtain the desired depth for each well, additional fabrication process steps must be taken (e.g., counter doping of the body region). The complicated design scheme of this particular configuration leads to a more complex and costly fabrication process. Unfortunately, counter doping of the body region is not as well controlled in manufacturing. The contact trench depth variation also affects the Schottky characteristics.

Embodiments of the Invention

Figure 4A:
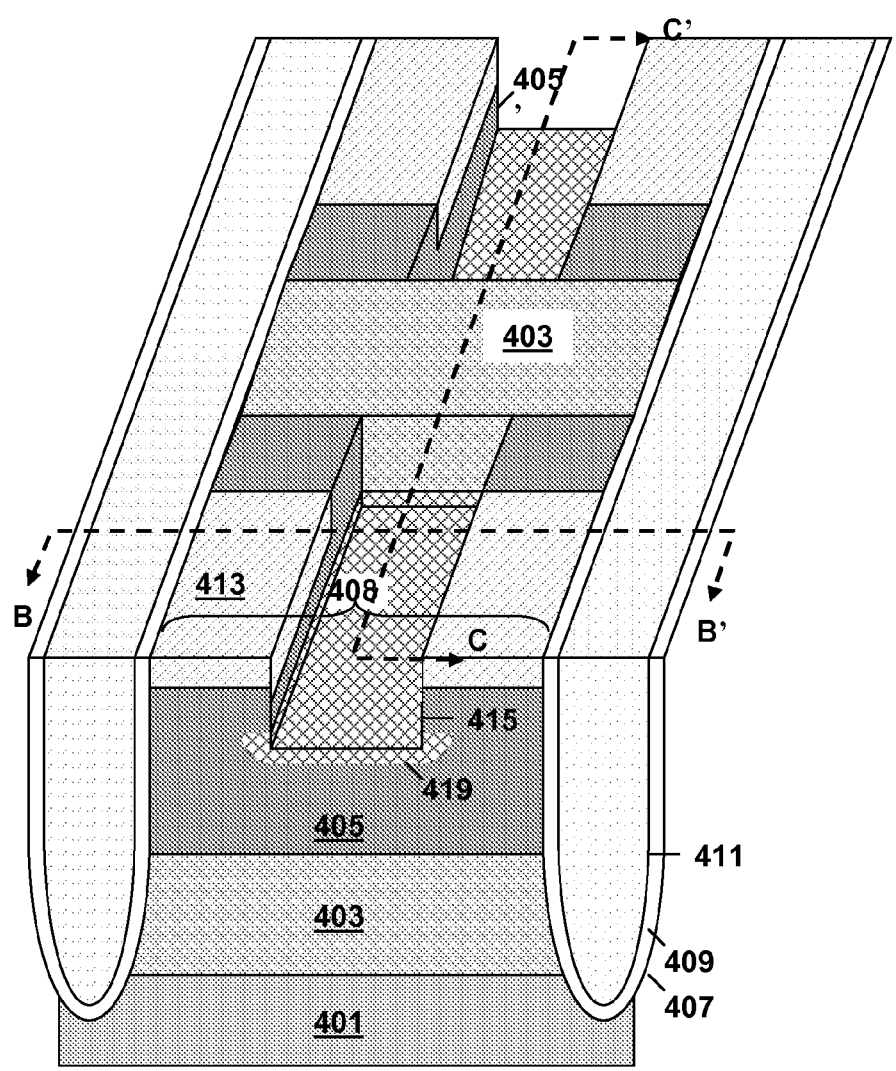
FIG. 4A is a three-dimensional schematic diagram of an integrated structure according to an embodiment of the present invention.
Figure 4B:
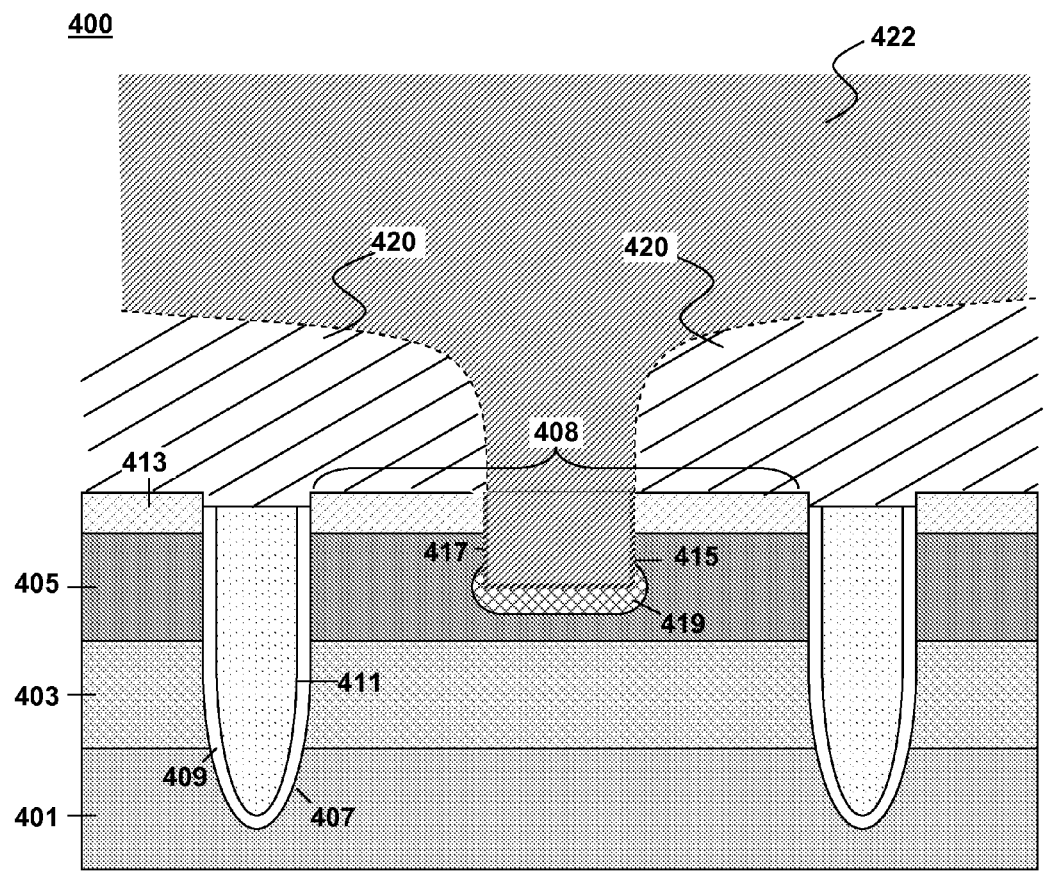
FIG. 4B is a cross-sectional schematic diagram along line B-B' of FIG. 4A.
Figure 4C:
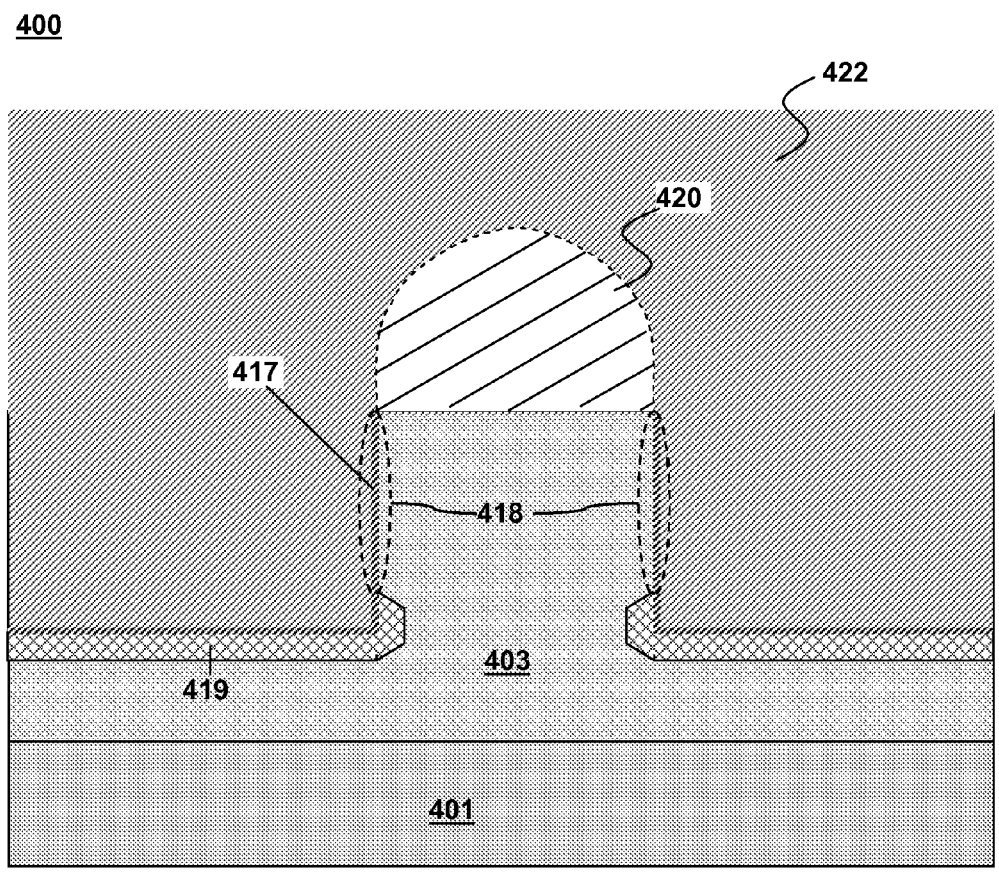
FIG. 4C is a cross-sectional schematic diagram along plane C-C' of FIG. 4A.

According to embodiments of the invention, an integrated structure may utilize many of the advantages associated with the configuration in FIG. 3, while also eliminating the complexity in device fabrication associated with that particular configuration. FIGS. 4A-4C illustrate different views of an integrated structure 400 comprising a MOSFET device and Schottky diode according to an embodiment of the present invention. FIG. 4A provides a three-dimensional view of a front portion of the integrated structure 400. FIG. 4B provides a cross-sectional view of a portion of the integrated structure 400 along plane B-B'. FIG. 4C provides a cross-sectional view of a portion of the integrated structure 400 along plane C-C'.

The integrated structure 400 comprises one or more MOSFET devices and one or more Schottky diodes, which may be connected in parallel to form a power MOSFET.

The integrated structure 400 is built on a substrate 401. By way of example and not by way of limitation, the substrate may be composed of material such as silicon, silicon dioxide, aluminum oxide, sapphire, germanium, gallium arsenide (GaAs), an alloy of silicon or germanium, indium phosphide (InP) or any other material upon which electronic devices (e.g., transistors, diodes, etc.) may be deposited. By way of example, and not by way of limitation, the substrate 401 may be heavily doped to form an n+ type substrate. An optional epitaxial layer 403 may be grown on the substrate in order to facilitate formation of electronic devices on the integrated structure 400. By way of example, and not by way of limitation, the epitaxial layer 403 may be an n type epitaxial layer. The epitaxial layer 403 may be lightly doped to support a higher device breakdown voltage, but does so at the expense of increased device internal resistance. The combination of a substrate 401 and epitaxial layer 403 will be referred to as a substrate composition hereinafter.

A plurality of trenches 407 are then formed into the epitaxial layer 403 and the substrate 401. Each trench 407 extends along the entire depth of the substrate 401 and epitaxial layer 403 as illustrated in FIG. 4B. The trenches 407 are substantially filled with a conductive material 411 that is separated from the trench walls by a thin layer of dielectric material 409. The conductive material 411 filling each trench acts as a gate region for each MOSFET device. By way of example, and not by way of limitation, the conductive material may be polysilicon and the dielectric material may be silicon dioxide.

Each pair of trenches 407 defines a mesa 408 therebetween. Two doped body regions 405, 405' of a conductivity type different than the substrate 401 or epitaxial layer 403 are formed within each mesa 408. By way of example, and not by way of limitation, the doped body regions 405, 405' may be p– type body regions. The two doped body regions 405, 405' are separated by an un-doped portion of the epitaxial layer 403 as illustrated in FIG. 4A. While not illustrated, it is important to note that the epitaxial layer 403 is optional and as such, the two doped body regions 405, 405' may be separated by an undoped portion of the substrate 401 instead of the epitaxial layer in other embodiments of the invention.

A pair of doped source regions 413 of a conductivity type different than the doped body region is formed inside each doped body region 405, 405'. By way of example, and not by way of limitation, the doped source regions 413 may be n+ type source regions if the body regions 405, 405' are doped p– type. The substrate 401 forms the drain region for each MOSFET device. Thus, each MOSFET device consists of a trenched gate 411, a body region 405 on both sides of the trenched gate 411, two source regions 413 built into the body region 405 adjacent to and on opposite sides of the trenched gate 409, and the substrate 401 acting as a drain.

A contact trench 415 is formed within each body region 405. The contact trench 415 extends along a portion of the depth of the substrate 401 and epitaxial layer 403, coming to an end at the interface between the body region 405, 405' and the epitaxial layer 403 separating the two doped body regions 405, 405'. Each contact trench 415 exposes a vertical sidewall of the epitaxial layer 403 separating the two doped body regions 405, 405'. A Schottky diode is formed along this vertical sidewall. While not illustrated, it is important to note that in an integrated structure not having an epitaxial layer, the exposed vertical sidewall is that of the substrate.

The Schottky diode comprises Schottky barrier metal 417 that can be formed within each contact trench and along each exposed vertical sidewall at the ends of the contact trench 415. For purposes of illustration, the Schottky barrier metal is not shown in the contact trench 415 in FIG. 4A, while FIGS. 4B and 4C depict the Schottky barrier metal 417 integrated with the MOSFET device and filling up the well. The Schottky barrier metal 417 forms the anode of the Schottky diode and the exposed vertical sidewalls of the epitaxial layer 403 forms the cathode of the Schottky diode. A Schottky junction 418 exists at the interface between the Schottky barrier metal 417 and the exposed vertical sidewall of the epitaxial layer 403. An insulator 420, such as borophosphosilicate glass (BPSG) may cover upper surfaces of the gate regions 411 and the epitaxial layer 403 while exposing portions of an upper surface of the source regions 413. A source metal 422 may make contact to the source regions 413 and the barrier metal 417.

A doped shielding region 419 of another conductivity type may be formed inside each doped body region 405. By way of example, and not by way of limitation, the doped shielding region 419 may be a p+ type doped region. The doped shielding region 419 may run along the bottom surface of the well 415, extending along the depth of the substrate 401 and epitaxial layer 403 at least beyond the Schottky junction 418, while surrounding the bottom corners of the contact trench 415. The doped shielding region 419 may also extend into a bottom portion of the exposed vertical sidewall of the epitaxial layer 403 separating the two doped body regions 405 as illustrated in FIG. 4C. This doped shielding region 419 forms a P-N junction at the Schottky junction 418 that acts to pinch-off the channel regions under the Schottky contacts to inhibit the formation of large reverse leakage currents caused by switching from forward bias to reverse bias.

The configuration as illustrated in FIGS. 4A-C has several advantages over the prior art. The Schottky diode is independent of the Trench MOSFET, but does not require the allocation of dedicated areas between MOSFETs solely for its formation. Rather, the Schottky diode is built inside the region designated for the MOSFET device. Additionally, the Schottky efficiently utilizes surface area by forming the Schottky junction 418 along the exposed vertical sidewall of the exposed portion of the epitaxial layer 403. Also, because the Schottky junction is formed along the vertical sidewall of exposed portion of the epitaxial layer 403, there is no need for the contact trench 415 housing the Schottky barrier metal to extend beyond the depth of the body region 405, 405'. This reduces the complexity of the integrated structure 400 and the total amount of processing steps necessary to fabricate the integrated structure 400. Finally, the Schottky diode is doubly shielded from the formation of large reverse leakage currents caused by switching by both the doped shielding region 405, 419 and the trenched gates 411.

A number of alternative configurations for integrated structures are within the scope of embodiments of the present invention.

Figure 5A:
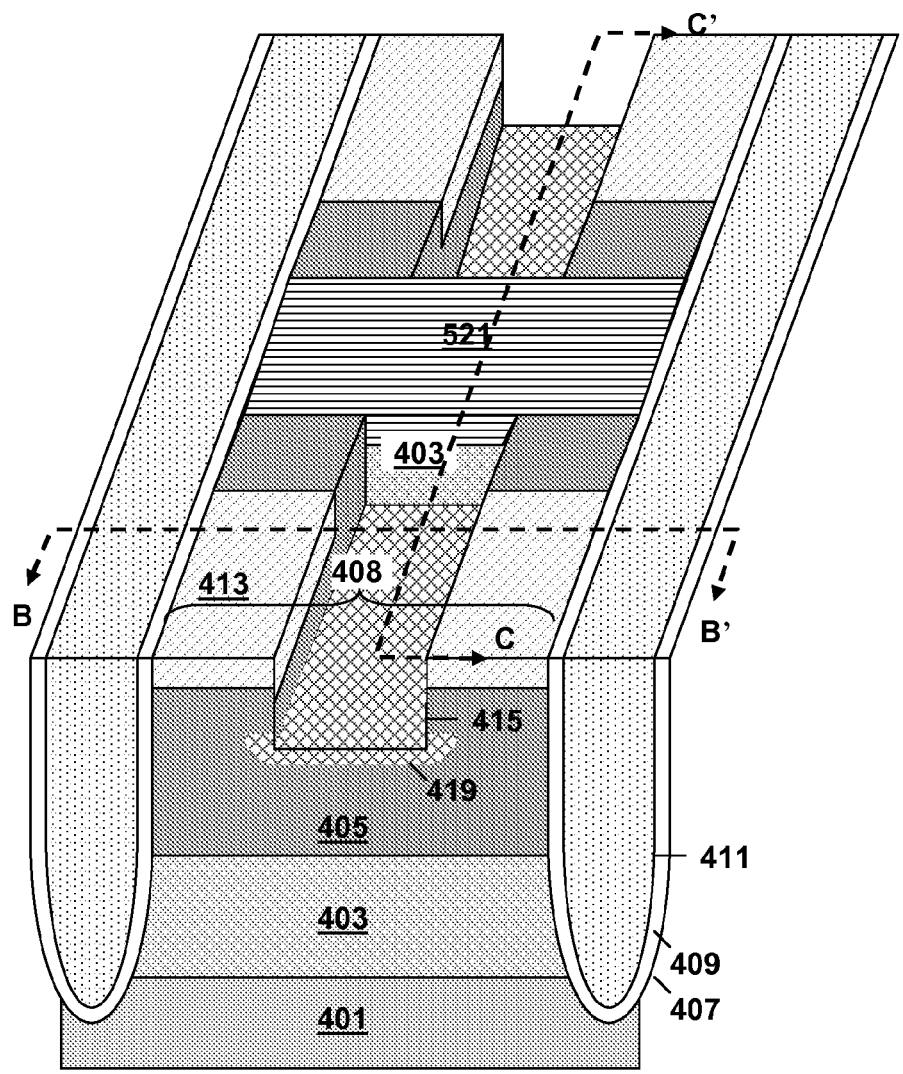
FIG. 5A is a three-dimensional schematic diagram of an integrated structure according to an alternative embodiment of the present invention.
Figure 5B:
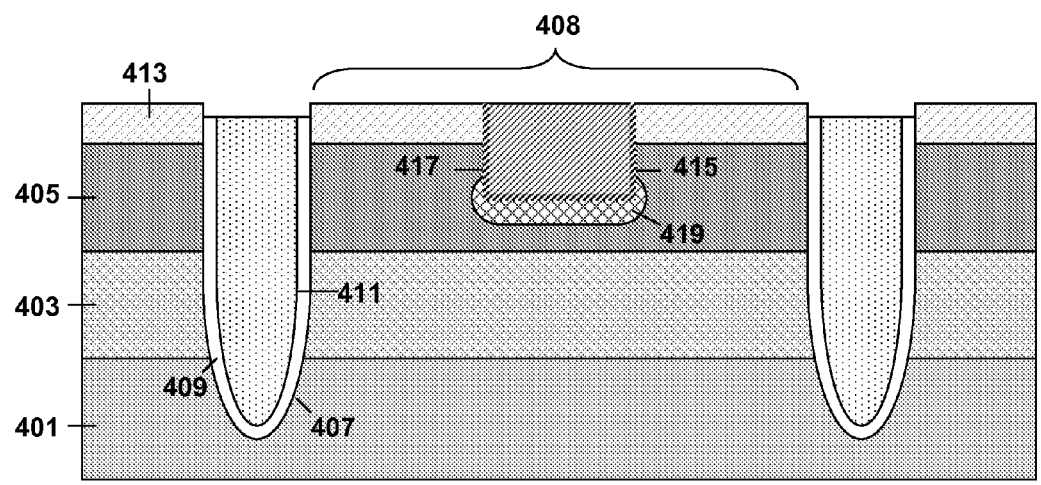
FIG. 5B is a cross-sectional schematic diagram along plane B-B' of FIG. 5A.
Figure 5C:
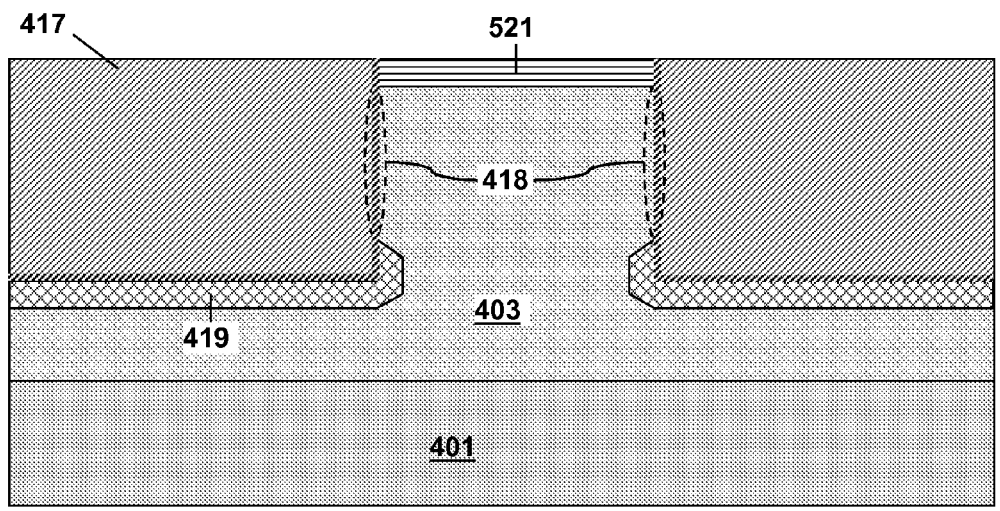
FIG. 5C is a cross-sectional schematic diagram along plane C-C' of FIG. 5A.

FIGS. 5A-5C are schematic diagrams illustrating multiple views of an integrated structure 500 comprising a MOSFET device and Schottky diode according to an alternative embodiment of the present invention. FIG. 5A provides a three-dimensional view of a front portion of the integrated structure 500. FIG. 5B provides a cross-sectional view of a portion of the integrated structure 500 along line B-B'. FIG. 5C provides a cross-sectional view of a portion of the integrated structure 500 along line C-C'. For purposes of illustration, the contact trench 415 has been left empty in FIG. 5A, while FIGS. 5B and 5C depict the Schottky barrier metal 417 integrated with the MOSFET device and filling up the contact trench 415.

The configuration of the integrated structure 500 in FIGS. 5A-5C is similar to the configuration of the integrated structure 400 in FIGS. 4A-4C except for a slight modification. In the integrated structure 500 of FIGS. 5A-5C, an additional doped shielding region 521 is formed on a top surface of an exposed portion of the epitaxial layer 403 in order to provide additional reverse leakage current shielding to the Schottky diode. By way of example and not by way of limitation, the additional doped shielding region 521 may be a p– type additional doped shielding region 521.

The configuration of the integrated structure 500 as illustrated in FIGS. 5A-5C maintains the same advantages over the prior art as discussed above with respect to FIGS. 4A-4C. The Schottky diode is independent of the Trench MOSFET, but does not require the allocation of dedicated areas between MOSFETs solely for its formation. Rather, the Schottky diode is built inside the region designated for the MOSFET device. Additionally, the Schottky efficiently utilizes surface area by forming a Schottky junction 418 along the exposed vertical sidewall of the epitaxial layer 403. Also, because the Schottky junction is formed along the exposed vertical sidewall of the epitaxial layer 403, there is no need for the contact trench 415 housing the Schottky barrier metal to extend beyond the depth of the body region 405, 405'. This reduces the complexity of the integrated structure 500 and the total amount of processing steps necessary to fabricate the integrated structure 500. Finally, the Schottky diode is triply shielded rather than doubly shielded from the formation of large reverse leakage currents caused by switching by the doped shielding region 419, the additional doped shielding region 521, and the trenched gates 411.

Figure 6A:
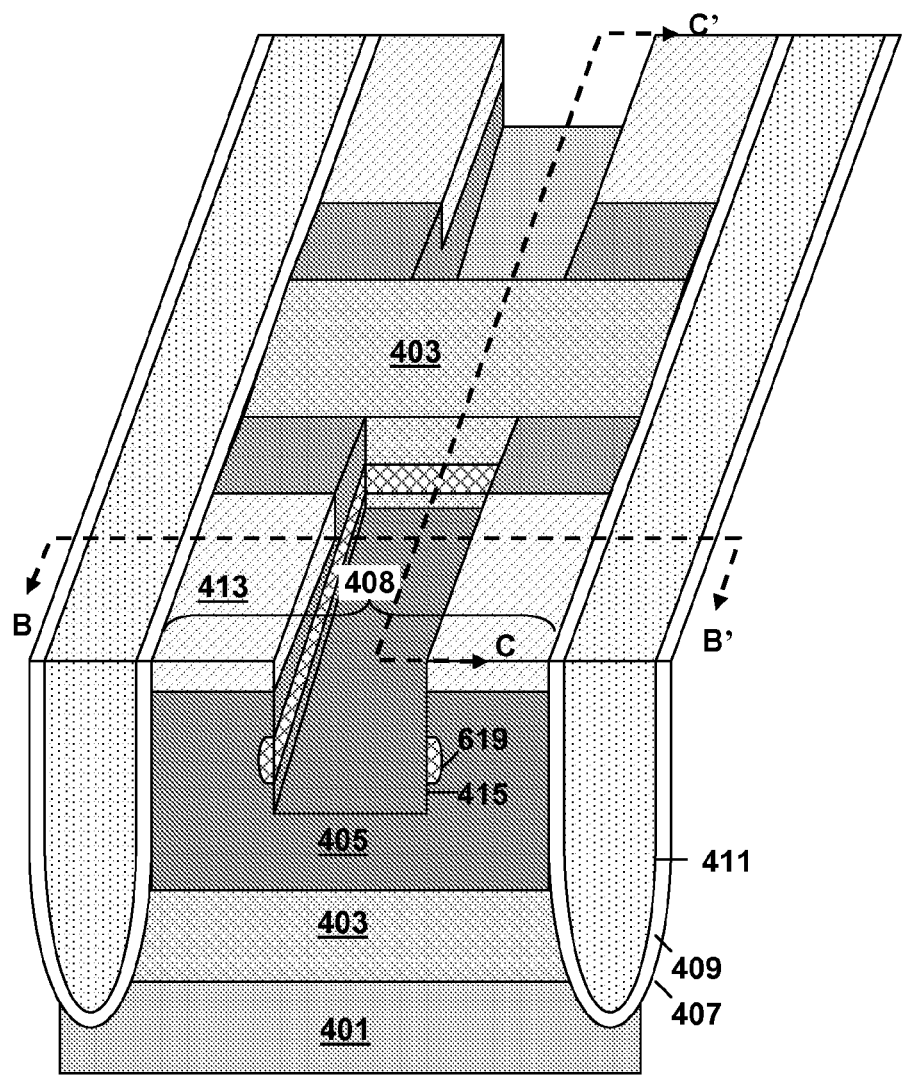
FIG. 6A is a three-dimensional schematic diagram of an integrated structure according to an alternative embodiment of the present invention.
Figure 6B:
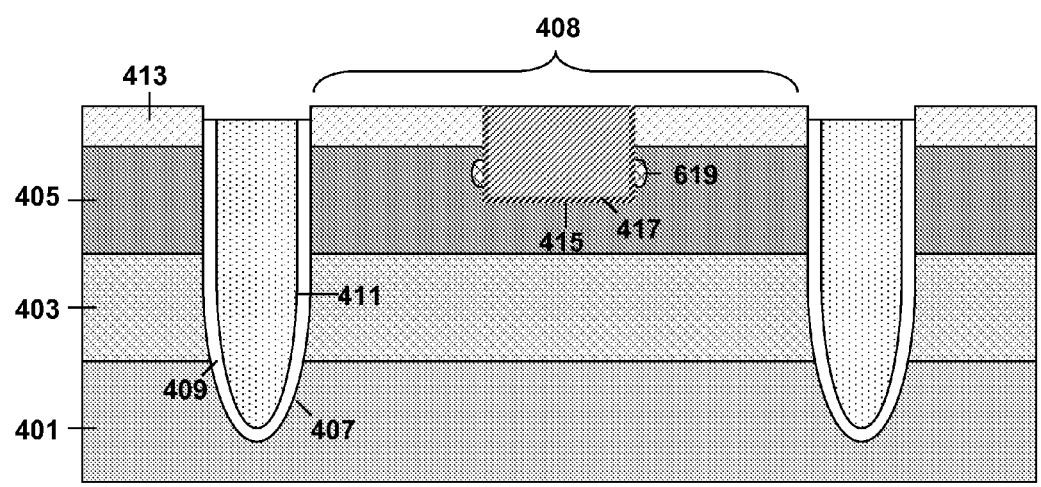
FIG. 6B is a cross-sectional schematic diagram along plane B-B' of FIG. 6A.
Figure 6C:
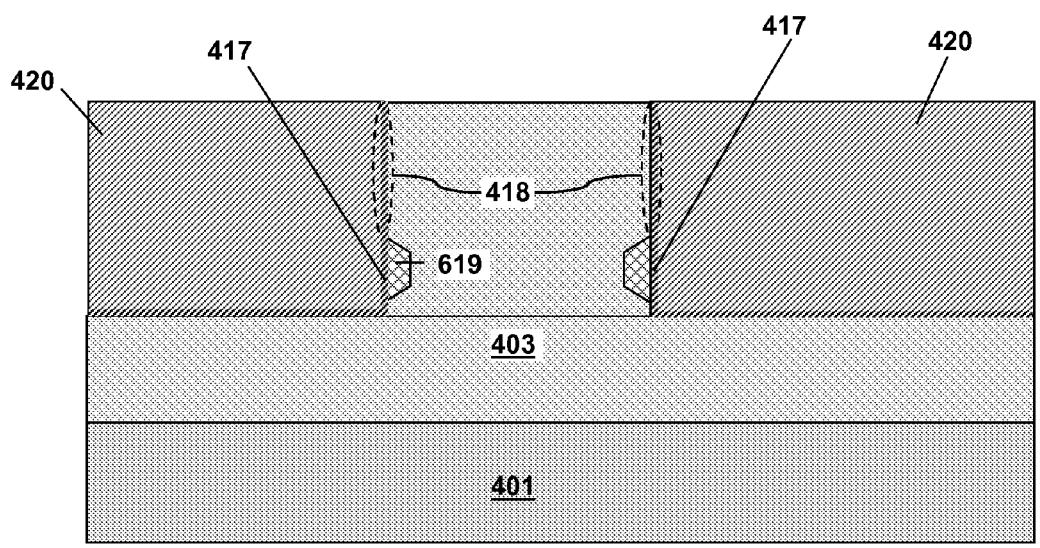
FIG. 6C is a cross-sectional schematic diagram along plane C-C' of FIG. 6A.

FIGS. 6A-6C are schematic diagrams illustrating multiple views of an integrated structure 600 comprising a MOSFET device and Schottky diode according to an alternative embodiment of the present invention. FIG. 6A provides a three-dimensional view of a portion of the integrated structure 600. FIG. 6B provides a cross-sectional view of a portion of the integrated structure 600 along line B-B'. FIG. 6C provides a cross-sectional view of a portion of the integrated structure 600 along line C-C'. For purposes of illustration, the contact trench 415 is shown empty in FIG. 6A, while FIGS. 6B and 6C depict the Schottky barrier metal 417 integrated with the MOSFET device and filling up the well 415.

The configuration of the integrated structure 600 in FIGS. 6A-6C mimics the configuration of the integrated structure 400 in FIGS. 4A-4C, except for a slight modification. In the integrated structure 600 of FIGS. 6A-6C, the doped shielding region 619 is formed along the sidewalls of the contact trench 415, extending along the depth of the doped body region 405. The doped shielding region 619 extends into a portion of the vertical sidewall of the epitaxial layer 403, and extends along the length of the vertical sidewall of the epitaxial layer 403 as illustrated in FIGS. 6B and 6C. By way of example and not by way of limitation, the doped shielding region 619 may be a p+ type doped shielding region.

The configuration of the integrated structure 600 as illustrated in FIGS. 6A-6C maintains the same advantages over the prior art as discussed above with respect to FIGS. 4A-4C. The Schottky diode is independent of the Trench MOSFET, but does not require the allocation of dedicated areas between MOSFETs solely for its formation. Rather, the Schottky diode is built inside the region designated for the MOSFET device. Additionally, the Schottky efficiently utilizes surface area by forming a Schottky junction 418 along vertical sidewall of an exposed portion of the epitaxial layer 403. Also, because the Schottky junction is formed along the exposed vertical sidewall of the epitaxial layer 403, there is no need for the contact trench 415 housing the Schottky barrier metal to extend beyond the depth of the body region 405, 405'. This reduces the complexity of the integrated structure 600 and the total amount of processing steps necessary to fabricate the integrated structure 600. Finally, the Schottky diode doubly shielded from the formation of large reverse leakage currents caused by switching by the doped shielding region 619 and the trenched gates 411.

Figure 7:
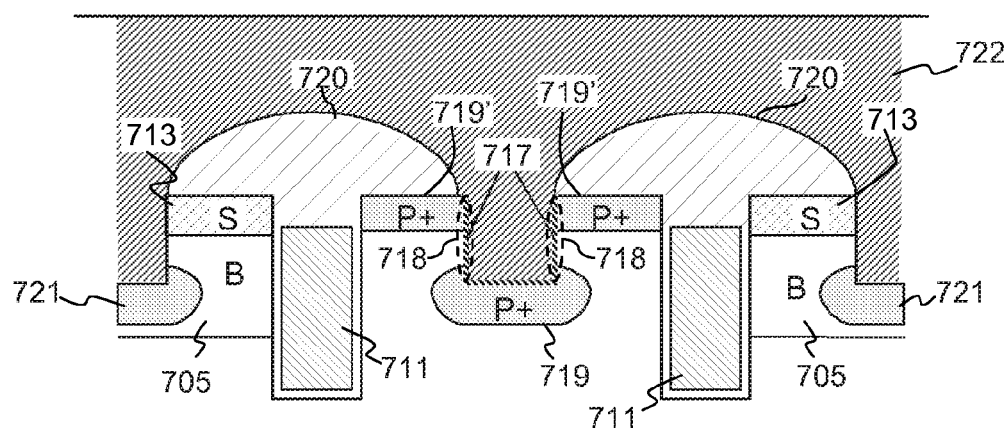
FIG. 7 is a cross-sectional schematic diagram of an integrated structure according to another alternative embodiment of the present invention.

According to another alternative embodiment, a junction barrier Schottky and MOSFET devices may be integrated in different adjacent mesas. FIG. 7 illustrates an example of a device 700 having such a configuration. The device 700 may include an epitaxial layer 703 on an underlying substrate 701. The substrate and epitaxial layer are doped with dopants of similar conductivity type. Body regions 705 formed in upper portions of the epitaxial layer 703 are doped to have the opposite conductivity type of the epitaxial layer. Deep trenches formed in one mesa accommodate a gate 711 and gate insulator. The gate 711 can be electrically isolated by an insulator 720. Source regions 713 doped with opposite conductivity type dopants to the body regions 705 may be formed in uppermost portions of the epitaxial layer proximate one side of the gate trench. Contact trenches can be formed on either side of each gate 711. A contact trench is formed on one side of the gate 711 next to the source region 713 so that the source region is between the contact trench and the gate. A body contact region 721 can be formed in the epitaxial layer 703 proximate the bottom of the contact trench. Contact trenches on mesas located between adjacent gate trenches accommodate a barrier metal 717 for a Schottky diode. The contact trenches can be filled with source metal that covers the source regions 713 and insulator 720.

A doped shielding region 719 can be formed in the epitaxial layer proximate a bottom of the Schottky trench. The doped shielding region 719 can be doped with opposite conductive type dopants to the epitaxial layer 703. Similarly, doped shielding regions 719' near the top of the diode trench on either side of the trench may optionally be doped with opposite doped with opposite conductive type dopants to the epitaxial layer 703. Schottky diode regions 718 are formed along sidewalls of the shallow trench.

Although the MOSFET and Schottky diode are not along the same mesa, there are some advantages of the structure of the device 700. For example, the Schottky diode trench is independent of the trench used to form the MOSFET and the diode contact region 719 does not need to be deeper than body junction. In addition, the Schottky area is adjustable due to the frequency of the contact trench. Furthermore the Schottky diode in the device 700 has the advantage of double shielding—due to the contact trench and shielding regions 719 and 719'. The structure of the device 700 may present a potential for high series Schottky resistance, but this can be overcome by wider mesa width in Schottky region. A wider trench may limit scaling and reduce trench shielding, however. When all factors are taken into consideration, the greater adjustability of the Schottky area, independence of the Schottky trench, and double shielding can outweigh other considerations.

Figure 8A:
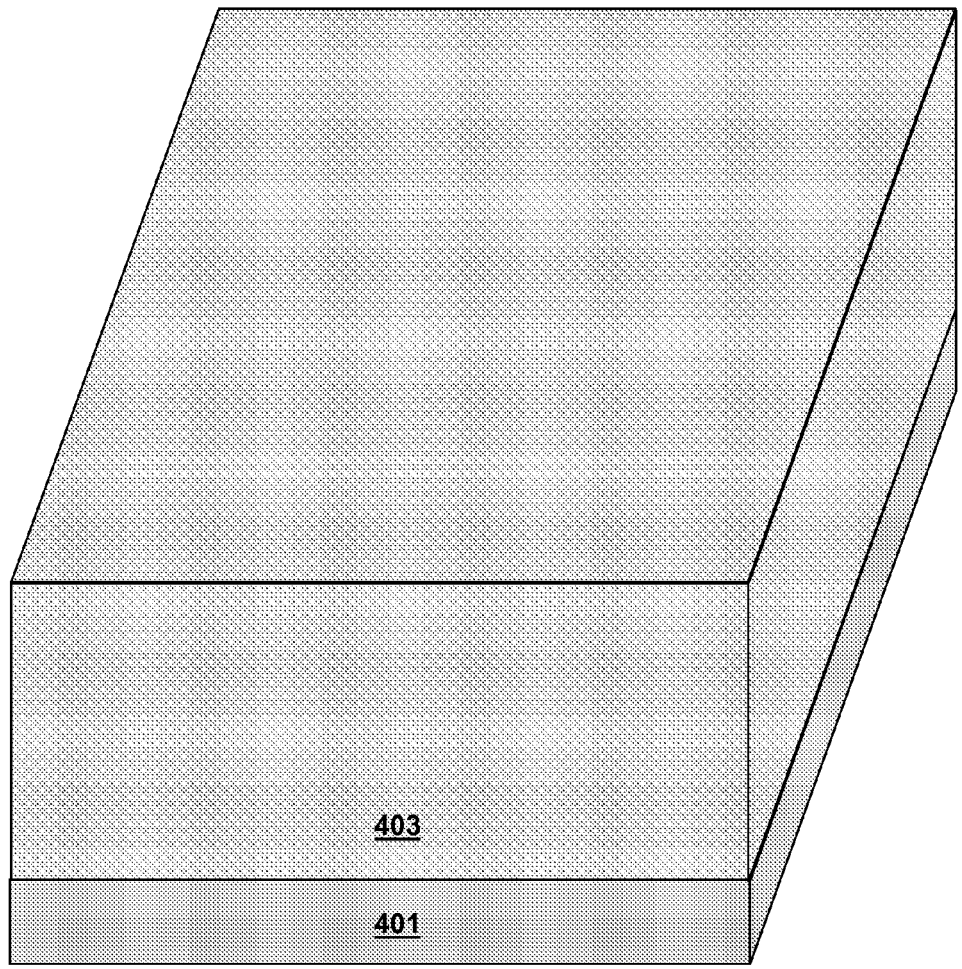
FIGS. 8A-8C illustrate an example of fabrication of an integrated structure of the type shown in FIGS. 4A-4C according to an embodiment of the present invention.
Figure 8B:
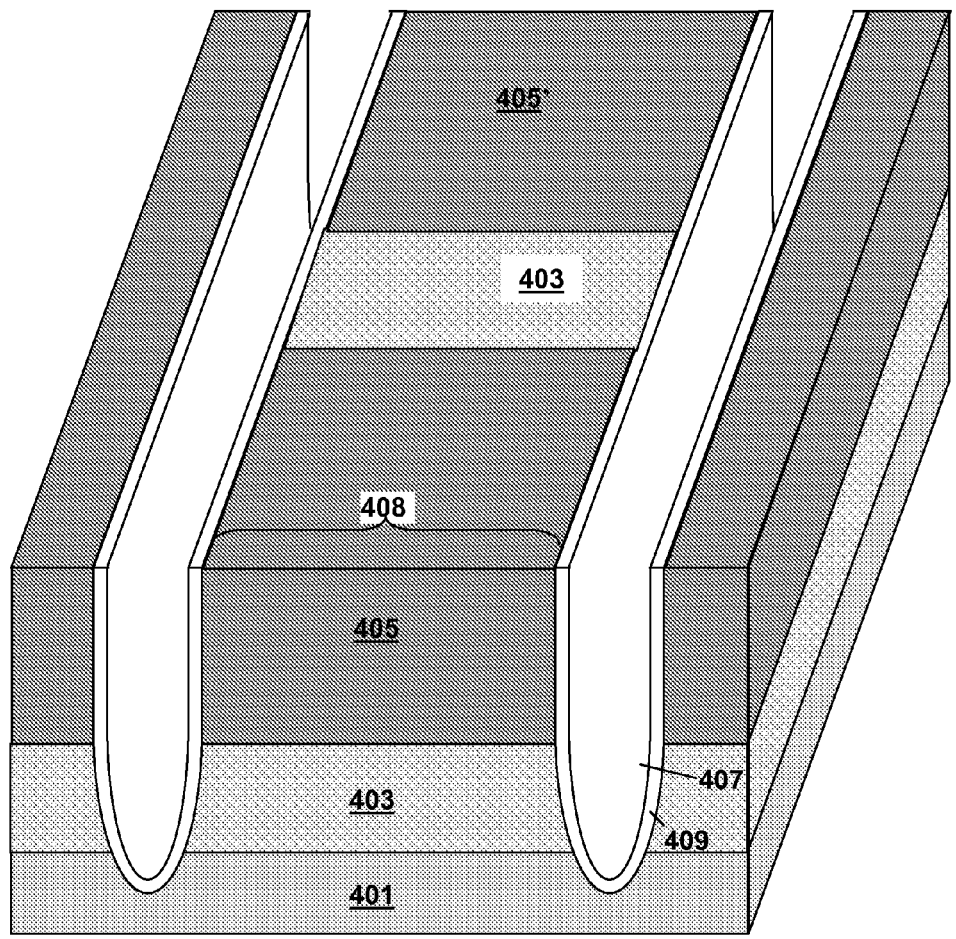
Figure 8C:
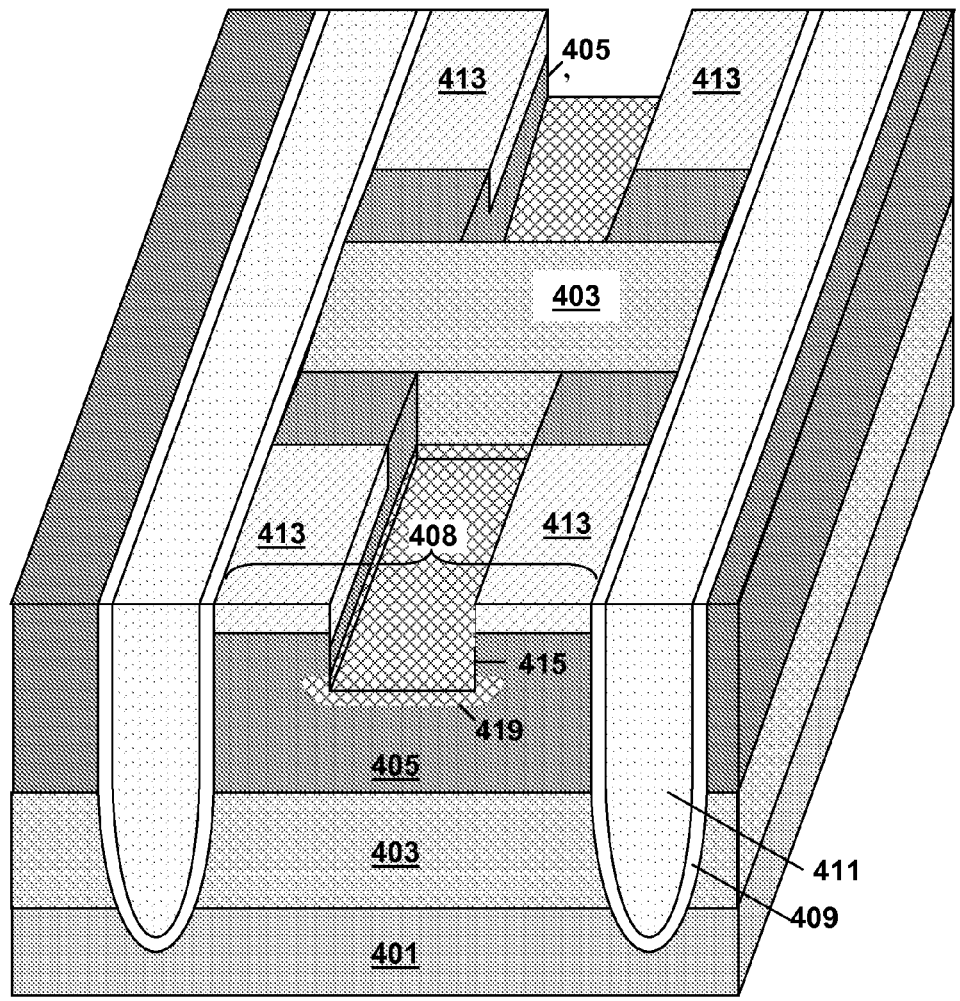

The integrated structures described above may be fabricated using relatively standard processing techniques with slight variations in one or more of the masks as necessary to define the desired structure. By way of example and not by way of limitation, the structure can be fabricated starting with a heavily-doped substrate 401 having a lightly-doped 403 expitaxial layer formed thereon, as shown in FIG. 8A. The epitaxial layer 403 may be doped with opposite conductivity type dopants, e.g., using ion implantation though a suitably configured mask, to form body regions 405,405' and define a mesa 408 that includes an exposed portion of the epitaxial layer 403 as shown in FIG. 8B. Trenches 407 may be formed either before or after such doping and lined with insulator 409. Portions of the trenches 407 not occupied by insulator 409 can be filled with conductive material 411 (e.g., polysilicon) to define gate electrodes, as shown in FIG. 8C. Additional doping of selected portions of the body regions 405, 405' though a suitable mask can form source regions 413.

Contact trenches 415 can be formed before or after the forming the source regions 413, e.g., by etching through a suitably configured contact mask. Further doping through a suitably configured mask may form the doped shielding region 419 for a Schottky diode inside each doped body region 405, 405' at the bottoms or sides of the contact trenches 415. The contact trenches 415 may be lined with a barrier metal. The gate electrodes 411 and exposed portion of the epitaxial layer 403 may be covered with an insulator, e.g., an oxide, leaving openings through which source metal can contact the source regions 413 and fill the remaining portions of the contact trenches 415.

Embodiments of the present invention provide for an integrated structure with significant advantages of previous structures in terms of simplified and less costly fabrication, and shielding from formation of large reverse leakage currents.

Although the present invention has been described in considerable detail with reference to certain preferred versions thereof, other versions are possible. Therefore, the spirit and scope of the appended claims should not be limited to the description of the preferred versions contained herein. Instead, the scope of the invention should be determined with reference to the appended claims, along with their full scope of equivalents.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

The reader's attention is directed to all papers and documents which are filed concurrently with this specification and which are open to public inspection with this specification, and the contents of any papers and documents incorporated herein by reference.

What is claimed is:

1. A method for forming an integrated structure combining one or more field effect transistors and a Schottky diode, the method comprising:
   a) forming a plurality of trenches formed into a semiconductor substrate and extending into the substrate thereby forming a plurality of mesas there between, each trench being substantially filled with a conductive material that is separated from the trench walls by a thin layer of dielectric material to form a gate region of one or more field effect transistors;
   b) forming at least two contact trenches in each mesa, each contact trench extending along a portion of depth of a doped body region of a first conductivity type opposite that of the substrate formed inside each mesa, whereby at least two contact trenches are separated by an exposed portion of the substrate, wherein each contact trench has an end that abuts the exposed portion of the substrate composition;
   c) forming a pair of doped source regions of a second conductivity type formed adjacent to and on opposite sides of each contact trench inside the doped body region; and
   d) forming a Schottky diode comprising Schottky barrier metal formed over the exposed portion of the substrate, the Schottky barrier metal forming a Schottky junction at an interface between the Schottky barrier metal and an exposed surface of the exposed portion of the substrate separating the two contact trenches.

2. The method of claim 1, further comprising forming a doped shielding region of the first conductivity type inside each doped body region, the doped shielding region extending along an entire depth of the doped body region and into a portion of the exposed vertical sidewall of the exposed portion of the substrate composition separating the two doped body regions.

3. The method of claim 2, wherein the doped shielding region is heavily doped.

4. The method of claim 2, wherein the substrate composition is a substrate.

5. The method of claim 2, wherein the substrate composition is a substrate with an epitaxial layer formed thereon.

6. The method of claim 5, wherein the portion of the substrate composition separating the two doped body regions is the epitaxial layer.

7. The method of claim 2, wherein the doped shielding region surrounds all bottom corners of the contact trench formed by the doped body region and extends into a bottom portion of the exposed vertical sidewall of the substrate.

8. The method of claim 7, further comprising forming an additional doped shielding region of the first conductivity type inside a top surface of the exposed portion of the substrate composition separating the two doped body regions.

9. The method of claim 2, wherein the doped shielding region extends along an entire width or length of sidewalls of the contact trench formed by the body regions, the doped shielding region also being formed within a portion of the exposed vertical sidewall of the substrate composition, the doped shielding region extending along an entire width or length of the exposed vertical sidewall.

10. The method of claim 2, wherein the first conductivity type is p type.

11. The method of claim 2, wherein the second conductivity type is n type.

12. The method of claim 2, wherein the Schottky diode and one or more MOSFET devices are integrated into different adjacent mesas.

13. A device, comprising:
   a) a plurality of trenches formed into a semiconductor substrate and extending into the substrate forming a plurality of mesas there between, each trench being substantially filled with a conductive material that is separated from the trench walls by a thin layer of dielectric material to form a gate region of one or more field effect transistors;
   b) at least two contact trenches formed in each mesa, each contact trench extending along a portion of depth of a doped body region of a first conductivity type opposite that of the substrate formed inside each mesa, whereby at least two contact trenches are separated by an exposed portion of the substrate, wherein each contact trench has an end that abuts the exposed portion of the substrate composition;
   c) a pair of doped source regions of a second conductivity type formed adjacent to and on opposite sides of each contact trench inside the doped body region; and
   d) a Schottky diode comprising Schottky barrier metal formed over the exposed portion of the substrate, the Schottky barrier metal forming a Schottky junction at an interface between the Schottky barrier metal and an exposed surface of the exposed portion of the substrate separating the two contact trenches.

14. The device of claim 13, wherein the Schottky barrier metal is formed within each contact trench and along each exposed vertical sidewall at the ends of the contact trench.

15. The device of claim 13, wherein the first conductivity type is p type.

16. The device of claim 13, wherein the second conductivity type is n type.

17. The device of claim 13, wherein the Schottky diode and one or more MOSFET devices are integrated into different adjacent mesas.

18. The device of claim 13, wherein the doped body regions are separated by the exposed portion of the substrate.

19. The device of claim 18, wherein the substrate includes an epitaxial layer formed thereon.

20. The device of claim 19, wherein the portion of the substrate separating the two doped body regions is the epitaxial layer.

* * * * *